United States Patent [19]
Asakawa

[11] Patent Number: 5,086,829
[45] Date of Patent: Feb. 11, 1992

[54] LIQUID COOLING APPARATUS WITH IMPROVED LEAKAGE DETECTION FOR ELECTRONIC DEVICES

[75] Inventor: Kyoichi Asakawa, Yamanashi, Japan

[73] Assignee: NEC Corporation, Japan

[21] Appl. No.: 726,323

[22] Filed: Jul. 5, 1991

[30] Foreign Application Priority Data

Jul. 12, 1990 [JP] Japan ................................. 2-184720

[51] Int. Cl.$^5$ ....................... G05D 23/00; F28F 27/00
[52] U.S. Cl. ..................................... 165/12; 165/11.1;
165/13; 165/70; 165/104.33; 361/385
[58] Field of Search ..................... 165/11.1, 12, 13, 70,
165/80.4, 104.33; 361/385

[56] References Cited

U.S. PATENT DOCUMENTS 4,698,728 10/1987 Tustamiwskyj et al. ............. 165/70
4,729,424 3/1988 Mizuno et al. ........................ 165/30

FOREIGN PATENT DOCUMENTS 0055597 3/1986 Japan ..................................... 165/70

Primary Examiner—John K. Ford
Attorney, Agent, or Firm—Laff, Whitesel, Conte & Saret

[57] ABSTRACT

A liquid cooling apparatus includes a heat exchanger, a tank, leakage sensors, first and second level sensors, a timer counter, and a control section. The heat exchanger cools a coolant to be supplied to a heat generating portion in an electronic device. The tank temporarily stores the coolant cooled by the heat exchanger before the coolant is supplied to the electronic device. The leakage sensors detect leakage of the coolant in a circulation path for repeatedly performing cooling and heat absorbing operations. The first and second level sensors detect a decrease in amount of the coolant in the tank. The timer counter counts a time interval between the instant at which a leakage detection output is output from one of the leakage sensors and the instant at which a coolant decrease detection output is output from one of the first and second level sensors. The control section stops an operation of the electronic device when a value of the timer counter is a predetermined value or less.

9 Claims, 3 Drawing Sheets

LIQUID COOLING APPARATUS WITH IMPROVED LEAKAGE DETECTION FOR ELECTRONIC DEVICES

BACKGROUND OF THE INVENTION

The present invention relates to a liquid cooling apparatus and, more particularly, to a treatment for leakage caused in a liquid cooling apparatus.

In a conventional cooling apparatus, as shown in FIG. 3, a coolant 3 cooled by a heat exchanger 51 of a cooling apparatus 5 is stored in a tank 52 through a pipe 4a. The coolant 3 stored in this tank 52 is supplied to a heat generating portion 62 in an electronic device 6 by a pump 54. The heat generating portion 62 is then cooled by the coolant 3.

The coolant 3 which is heated upon cooling the heat generating portion 62 is returned to the heat exchanger 51 through a pipe 4b. The coolant 3 is cooled by the heat exchanger 51 again and is supplied to the heat generating portion 62 through the pipe 4a, the tank 52, and the pump 54.

In the cooling apparatus 5, a decrease in amount of the coolant 3 stored in the tank 52 is detected by a level switch 53, and the detection result is input to a control section 50 through a signal line 111. The heat exchanger 51 and the pump 54 are controlled by the control section 50 through signal lines 113 and 112.

In the electronic device 6, power V is supplied from a power supply 61 controlled by a control section 60 to the heat generating portion 62. The heat generating portion 62 is driven by this power V. The control section 60 and the power supply 61 are connected to the control section 50 of the cooling apparatus 5 through a signal line 114.

If an abnormality occurs in the cooling apparatus 5 while the cooling apparatus 5 and the electronic device 6 are operated, the control section 50 of the cooling apparatus 5 turns off the power supply 61 of the electronic device 6 to prevent the heat generating portion 62 from being heated to a high temperature.

In such a conventional liquid cooling apparatus, in order to prevent the heat generating portion 62 from being heated to a high temperature when the amount of the coolant 3 circulating through the pipes 4a and 4b is reduced, only when a decrease in amount of the coolant in the tank is detected by the level switch 53, the power supply 61 of the electronic device 6 is turned off under the control of the control section 50. For this reason, even if the amount of coolant is gradually decreased and the power supply 61 need not be turned off, the power supply 61 may be turned off.

In addition, assume that only a small amount of the coolant 3 leaks and is stored in drain pans 55 and 63 of the cooling apparatus 5 and the electronic device 6 so as not to leak outside, and hence an operation can be continued. Even in such a case, the power supply 61 of the electronic device 6 is immediately turned off under the control of the control section 50. Therefore, the above-described control poses a problem in a computer system and the like which are greatly influenced by the interruption of an operation.

SUMMARY OF THE INVENTION

It is an object of the present invention to provide a liquid cooling apparatus which allows an electronic device to be continuously operated when a coolant gradually leaks or a coolant amount is gradually decreased and no urgent treatment is required.

It is another object of the present invention to provide a liquid cooling apparatus most suitable for a computer system which is greatly influenced by the interruption of an operation.

In order to achieve the above objects, according to the present invention, there is provided a liquid cooling apparatus characterized by comprising a heat exchanger for cooling a coolant to be supplied to a heat generating portion in an electronic device, a tank for temporarily storing the coolant cooled by the heat exchanger before the coolant is supplied to the electronic device, leakage detecting means for detecting leakage of the coolant in a circulation path for repeatedly performing cooling and heat absorbing operations, coolant detecting means for detecting a decrease in amount of the coolant in the tank, timer counter means for counting a time interval between an instant at which a leakage detection output is output from the leakage detecting means and an instant at which a coolant decrease detection output is output from the coolant detecting means, and control means for stopping an operation of the electronic device when a value of the timer counter means is a predetermined value or less.

DESCRIPTION OF THE PREFERRED EMBODIMENT

An embodiment of the present invention will be described below with reference to the accompanying drawings.

Figure 1:
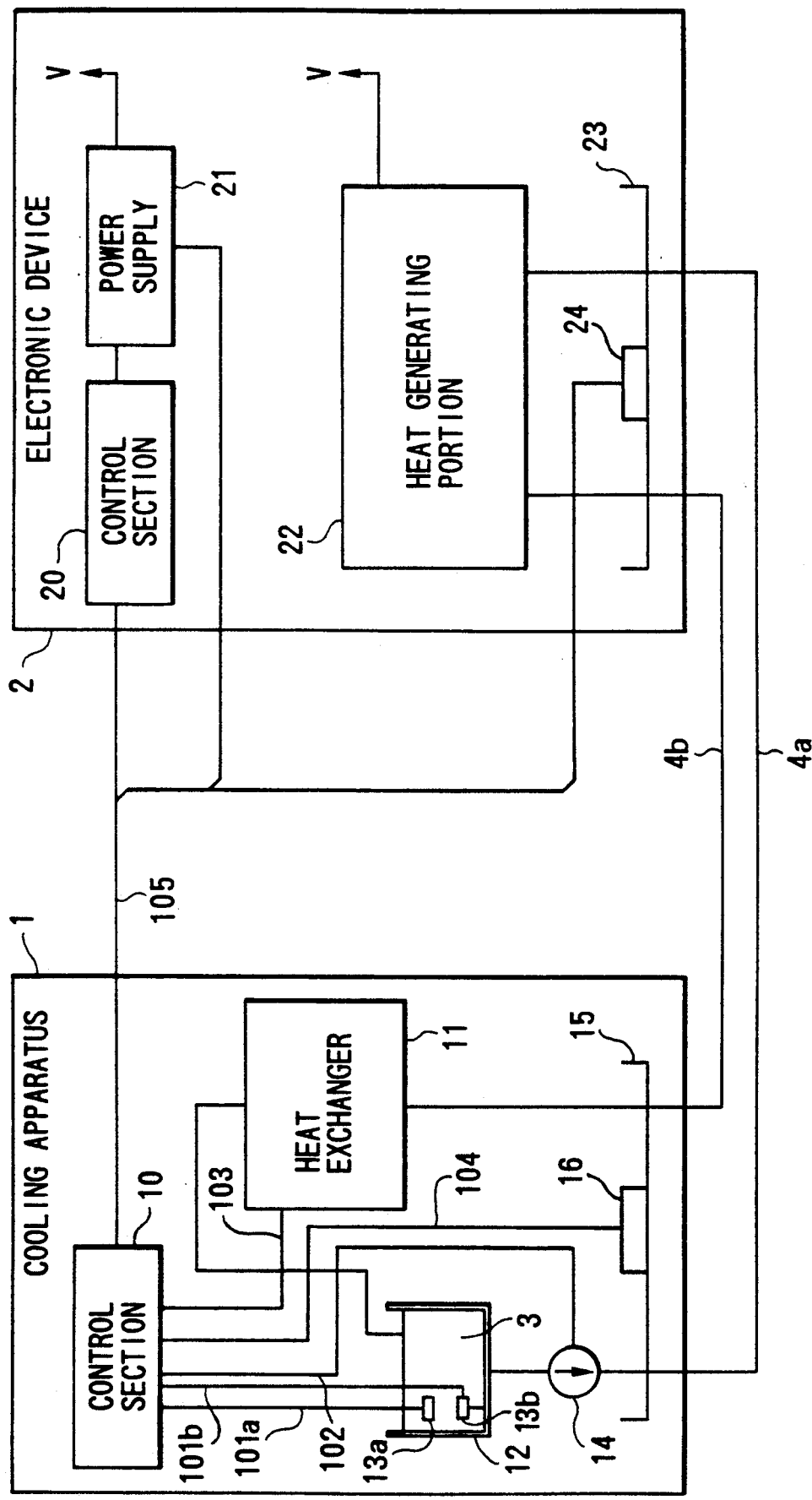
FIG. 1 is a block diagram showing an arrangement of an embodiment of the present invention.

FIG. 1 shows an arrangement of an embodiment of the present invention. Referring to FIG. 1, a coolant 3 cooled by a heat exchanger 11 of a cooling apparatus 1 is stored in a tank 12 through a pipe 4a. The coolant 3 stored in this tank 12 is supplied to a heat generating portion 22 in an electronic device 2 by a pump 14. The heat generating portion 22 is cooled by the coolant 3.

The coolant 3 used to cool the heat generating portion 22 is returned to the heat exchanger 11 through a pipe 4b. The coolant 3 is cooled by the heat exchanger 11 again and is supplied to the heat generating portion 22 through the pipe 4a, the tank 12, and the pump 14.

In the cooling apparatus 1, a decrease in amount of the coolant 3 stored in the tank 12 is detected by first and second level sensors 13a and 13b. The first level sensor 13a monitors whether the level of the coolant 3 is at a predetermined level or higher from the bottom of the tank 12, and outputs a first detection signal if the level is below the predetermined level. The second level sensor 13b monitors whether the level of the coolant 3 is at the predetermined level or lower and higher than a predetermined level near the bottom of the tank 12, and outputs a second detection signal if the level is below the predetermined level near the bottom. These first and second detection signals are input to a control section 10 through signal lines 101a and 101b. The heat exchanger 11 and the pump 14 are controlled by the control section 10 through signal lines 103 and 102.

In the electronic device 2, power V is supplied from a power supply 21 controlled by a control section 20 to the heat generating portion 22. The heat generating portion 22 is driven by this power V. The control section 20 and the power supply 21 are connected to the control section 10 of the cooling apparatus 1 through a signal line 105.

A portion of the coolant 3 which leaks out of a circulation path for allowing the coolant 3 to circulate through the cooling apparatus 1 and the electronic device while repeatedly performing cooling and heat absorbing operations is stored in drain pans 15 and 23 of the cooling apparatus 1 and the electronic device 2. These drain pans 15 and 23 respectively include leakage sensors 16 and 24 for detecting leakage of the coolant 3. Each of the sensors 16 and 24 has a detecting circuit in which two conductive lines connected to each other through a resistor having a high resistance are held in a state wherein they are close to each other but are not electrically connected. With this arrangement, when a coolant leaks, the resistance between the two lines is decreased, and the leakage is detected. The detection outputs are input to the control section 10 through signal lines 104 and 105.

An operation of this embodiment will be described next with reference to FIGS. 1 and 2.

Figure 2:
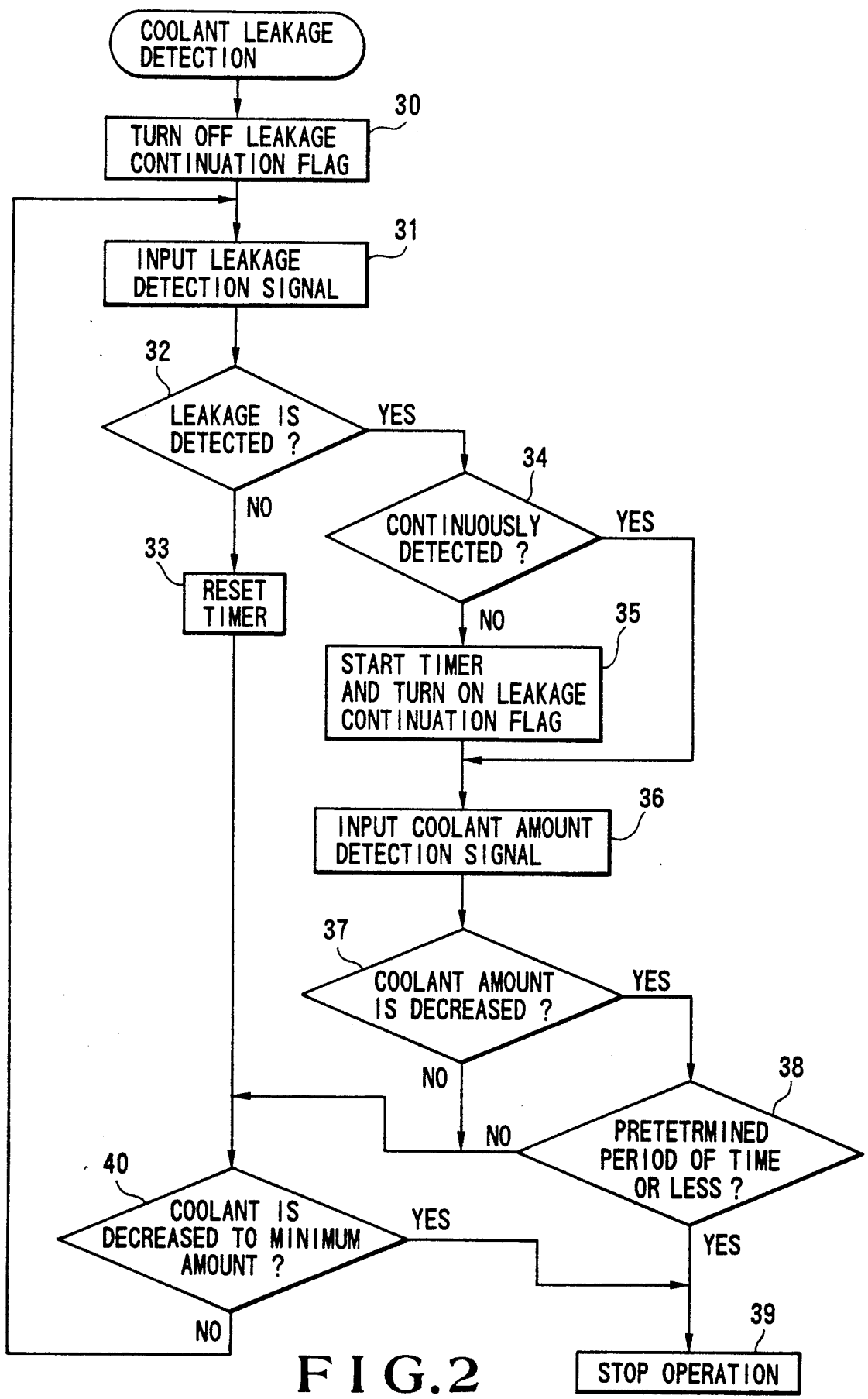
FIG. 2 is a flow chart showing an operation of the embodiment.
Figure 3:
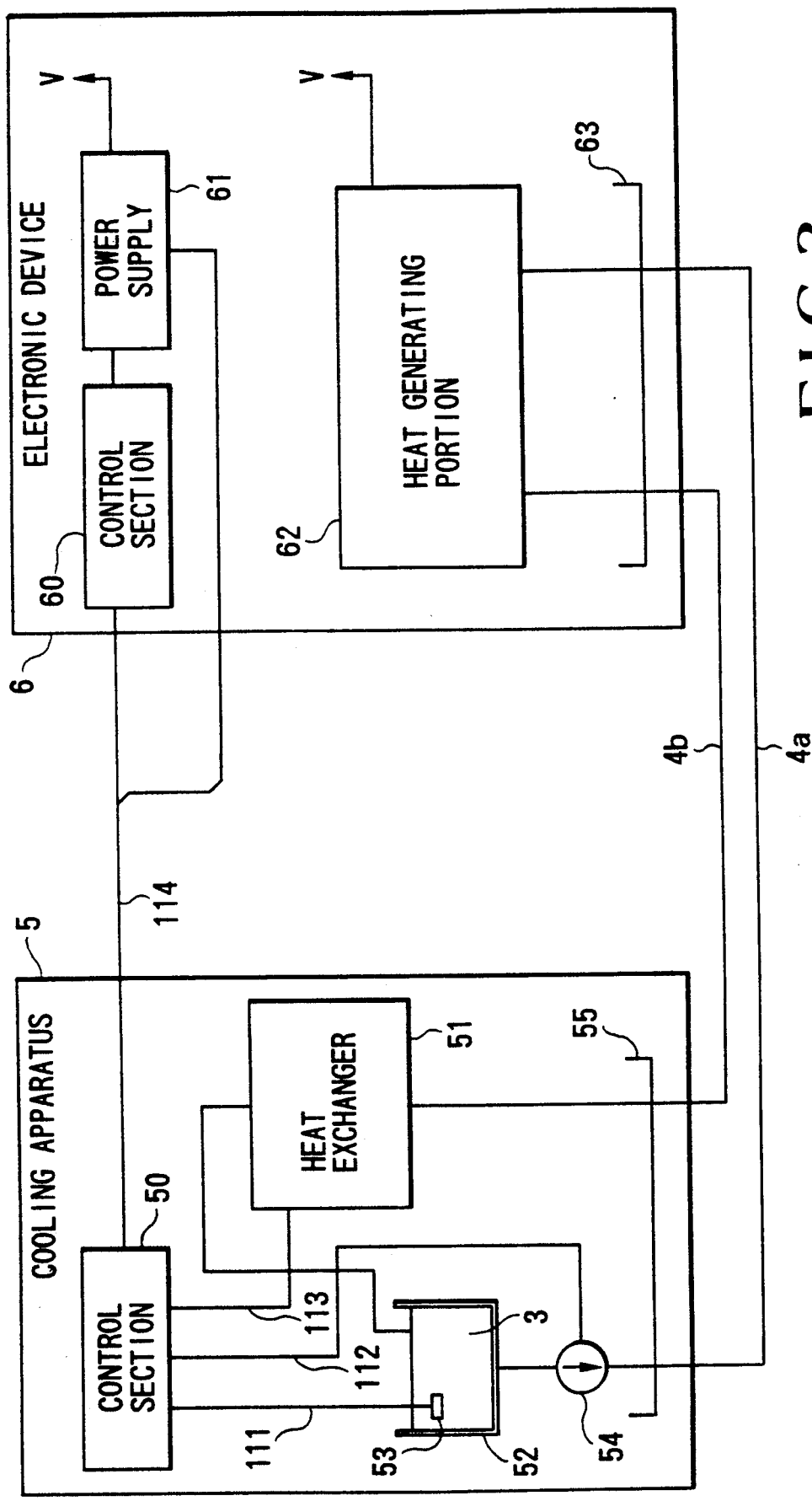
FIG. 3 is a block diagram showing an arrangement of a conventional apparatus.

In the control section 10, a leakage continuation flag ON/OFF-controlled by signals from the leakage sensors 16 and 24 is turned off (step 30 in FIG. 2).

Subsequently, the control section 10 receives leakage detection signals from the leakage sensors 16 and 24 through the signal lines 104 and 105 (step 31 in FIG. 2). On the basis of these leakage detection signals, the control section 10 checks whether leakage of the coolant 3 occurred in the cooling apparatus 1 and the electronic device 2 (step 32 in FIG. 2).

The control section 10 has a timer counter constituted by a software interrupt counter. If no leakage of the coolant 3 is detected form leakage detection signals form the leakage sensors 16 and 24, the timer is reset (step 33 in FIG. 2).

The amount of the coolant 3 in the tank 12 is detected by the second level sensor 13b to check whether the minimum amount of the coolant 3 remains (step 40 in FIG. 2). If a sufficient amount of the coolant 3 is still left, the control section 10 receives leakage detection signals from the leakage sensors 16 and 24 again (step 31 in FIG. 2).

If leakage of the coolant 3 is detected from the leakage detection signals from the sensors 16 and 24, the control section 10 checks whether the leakage continuation flag is ON, i.e., the leakage is continuously detected (step 34 in FIG. 2).

If leakage of the coolant 3 is detected for the first time, the control section 10 starts the timer and turns on the leakage continuation flag (step 35 in FIG. 2).

If the leakage of the coolant 3 is continuously detected, and the timer is started, the control section 10 receives a coolant amount detection signal from the first level sensor 13a in the tank 12 (step 36 in FIG. 2).

Subsequently, a decrease in amount of the coolant 3 in the tank 12 is checked on the basis of the coolant amount detection signal from the first level sensor 13a (step 37 in FIG. 2).

If the control section 10 determines from the detection signal from the first level sensor 13a that the amount of the coolant 3 in the tank 12 is not decreased, it checks whether the minimum amount of the coolant 3 remains (step 40 in FIG. 2). If a sufficient amount of the coolant 3 is still left, the control section 10 receives leakage detection signals from the leakage sensors 16 and 24 again (step 31 in FIG. 2).

If the control section 10 determines from the detection signal from the first level sensor 13a that the amount of the coolant 3 in the tank 12 is decreased, it checks whether the value of the timer corresponds to a predetermined period of time or less (step 38 in FIG. 2).

If the value of the timer corresponds to the predetermined period of time or more, i.e., if the time interval between the detection of leakage of the coolant 3 and the detection of a decrease in amount of the coolant 3 in the tank 12 is long, it is determined that the operation need not be immediately stopped. In this case, the cooling apparatus 1 and the electronic device 2 are continuously driven, and the leakage of the coolant 3 and the decrease in coolant amount are notified to the control section 20 of the electronic device 2, thus causing an operator to recognize them.

It is checked by the second level sensor 13b whether the coolant 3 is decreased to the minimum amount (step 40 in FIG. 2). If a sufficient amount of the coolant 3 is still left, the control section 10 receives leakage detection signals from the leakage sensors 16 and 24 again (step 31 in FIG. 2).

If the value of the timer corresponds to the predetermined period of time or less, i.e., the time interval between the detection of leakage of the coolant 3 and the detection of a decrease in coolant amount, it is determined that a large amount of the coolant 3 leaked in the circulation path, the operation of the cooling apparatus 1 is immediately stopped, and a stop command is output to the control section 20 of the electronic device 2 through the signal line 102.

With this operation, the control section 20 of the electronic device 2 turns off the power supply 21 to prevent the heat generating portion 22 from being heated to a high temperature (step 39 in FIG. 2).

Note that if it is determined from the detection signal from the second level sensor 13b that the coolant 3 is decreased to the minimum amount, the cooling apparatus 1 and the electronic device 2 are stopped in the same manner as described above (step 40 in FIG. 2).

As has been described above, according to the present invention, if a coolant gradually leaks or a coolant amount is gradually decreased, i.e., no urgent treatment is required, an electronic device can be continuously operated.

What is claimed is:

1. A liquid cooling apparatus characterized by comprising:

a heat exchanger for cooling a coolant to be supplied to a heat generating portion in an electronic device;

a tank for temporarily storing the coolant cooled by said heat exchanger before the coolant is supplied to the electronic device;

leakage detecting means for detecting leakage of the coolant in a circulation path for repeatedly performing cooling and heat absorbing operations;

coolant detecting means for detecting a decrease in amount of the coolant in said tank;

timer counter means for counting a time interval between an instant at which a leakage detection output is output from said leakage detecting means and an instant at which a coolant decrease detection output is output from said coolant detecting means; and control means for stopping an operation of the electronic device when a value of said timer counter means is not more than a predetermined value.

2. An apparatus according to claim 1, wherein said leakage detection means is arranged in a drain pan of a cooling unit in which said heat exchanger and said tank are arranged.

3. An apparatus according to claim 1, wherein said leakage detecting means is arranged in a drain pan of the electronic device.

4. An apparatus according to claim 1, wherein said leakage detecting means includes a detecting circuit in which two conductive lines connected to each other through a resistor having a high resistance are held to be close to each other so as not to be electrically connected to each other, and a resistance between said conductive lines is reduced upon occurrence of leakage of the coolant, thereby detecting the leakage of the coolant.

5. An apparatus according to claim 1, wherein said coolant detecting means comprises a first level sensor for outputting a detection signal when an amount of coolant in said tank is slightly decreased, and a second level sensor for outputting a detection signal when the amount of coolant in said tank is greatly decreased.

6. An apparatus according to claim 5, wherein said timer counter means counts a time interval between an instant at which a leakage detection output is output from said leakage detecting means and an instant at which a detection output is output from said first level sensor.

7. An apparatus according to claim 5, wherein said control means immediately stops an operation of the electronic device when a detection output is output from said second level sensor.

8. An apparatus according to claim 1, wherein said timer counter means is always reset when no detection signal is output from said leakage detecting means, and a time counting operation thereof is started in response to a first leakage detection output from said leakage detecting means.

9. An apparatus according to claim 1, wherein said control means stops an operation of the electronic device by turning off a power supply therefor.

* * * * *